United States Patent
Yoshikawa

(10) Patent No.: US 8,902,006 B2
(45) Date of Patent: Dec. 2, 2014

(54) SIGNAL PROCESSING APPARATUS AND METHOD AND COMMUNICATION APPARATUS

(71) Applicant: Sony Corporation, Tokyo (JP)

(72) Inventor: Naoto Yoshikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 21 days.

(21) Appl. No.: 13/898,848

(22) Filed: May 21, 2013

(65) Prior Publication Data
US 2013/0314154 A1 Nov. 28, 2013

(30) Foreign Application Priority Data
May 28, 2012 (JP) ................................. 2012-120416

(51) Int. Cl.
*H03G 3/10* (2006.01)
*H03H 7/25* (2006.01)
*H03G 11/04* (2006.01)

(52) U.S. Cl.
CPC ........ *H03H 7/25* (2013.01); *H03G 11/04* (2013.01)
USPC .......................................... 330/284; 330/254

(58) Field of Classification Search
USPC .................. 330/284, 51, 254, 261; 333/81 R
See application file for complete search history.

(56) References Cited

U.S. PATENT DOCUMENTS

| 7,053,715 B2 * | 5/2006 | Behzad et al. ................ 330/284 |
| 7,102,428 B2 * | 9/2006 | Behzad ........................... 330/51 |
| 7,714,658 B1 * | 5/2010 | Striflier ......................... 330/284 |
| 8,058,926 B2 * | 11/2011 | Saman et al. ................. 327/560 |
| 8,497,735 B2 * | 7/2013 | Gilbert .......................... 330/254 |
| 2010/0138681 A1 | 6/2010 | Kato |

\* cited by examiner

*Primary Examiner* — Henry Choe
(74) *Attorney, Agent, or Firm* — Rader, Fishman & Grauer PLLC

(57) ABSTRACT

The present disclosure provides a signal processing apparatus including: a short-circuiting controlling section configured to control whether or not the input side of a resistor connected between an input terminal and an output terminal and the output terminal are to be short-circuited in response to a signal level of a signal inputted from the input terminal; and a connection controlling section configured to control whether or not a resistor member is to be connected between the output terminal and a reference potential in response to the signal level of the signal, wherein at least one of the short-circuiting controlling section and the connection controlling section includes a plurality of switches disposed in parallel to each other for changing over a state thereof between open and closed states at signal levels different from each other.

16 Claims, 13 Drawing Sheets

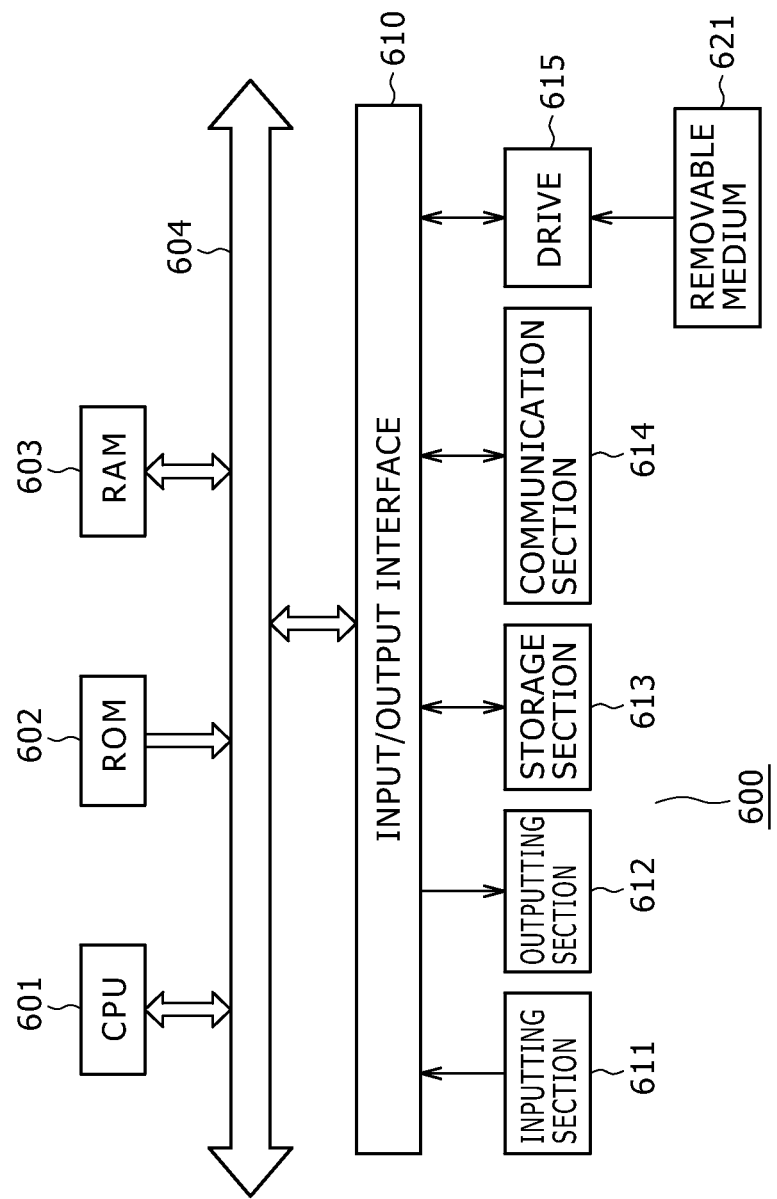

SIGNAL PROCESSING APPARATUS AND METHOD AND COMMUNICATION APPARATUS

BACKGROUND

The present technology relates to a signal processing apparatus and method and a communication apparatus, and particularly to a signal processing apparatus and method and a communication apparatus which suppress increase of the circuit scale and the power consumption and can continuously vary the attenuation amount.

Usually, the signal level of an input signal to a variable gain amplifier circuit mounted on an RF (radio frequency) front end is attenuated using an attenuator on a stage preceding to the variable gain amplifier circuit in order to improve the distortion characteristic of the input signal. A method has been proposed which uses, as the attenuator, for example, a capacitor attenuator configured from a capacitor or a resistor attenuator configured from a resistor ladder, as disclosed, for example, in U.S. patent Ser. No. 10/138,681 (hereinafter referred to as Patent Document 1).

SUMMARY

However, in the case where a capacitor attenuator is used, a plurality of variable gain amplifier circuits are involved. Therefore, there is the possibility that the circuit scale or the power consumption may increase.

In contrast, the method disclosed in Patent Document 1 uses a resistor attenuator. However, in this instance, the attenuation amount is controlled using a digital value, and the gain controlling characteristic is a stepwise characteristic. Therefore, the signal level varies at a moment, and as a result, there is the possibility that an instantaneous luminance variation may be observed on a display image, namely, the picture quality may be deteriorated.

Therefore, it is desirable to provide a signal processing apparatus and method and a communication apparatus which suppress increase of the circuit scale and the power consumption and can vary the attenuation amount continuously.

According to an embodiment of the present technology, there is provided a signal processing apparatus including a short-circuiting controlling section configured to control whether or not the input side of a resistor connected between an input terminal and an output terminal and the output terminal are to be short-circuited in response to a signal level of a signal inputted from the input terminal, and a connection controlling section configured to control whether or not a resistor member is to be connected between the output terminal and a reference potential in response to the signal level of the signal, wherein at least one of the short-circuiting controlling section and the connection controlling section includes a plurality of switches disposed in parallel to each other for changing over a state thereof between open and closed states at signal levels different from each other.

The signal processing apparatus may be configured such that the switches are individually configured from an MOS (metal oxide semiconductor) transistor whose gate potential varies in response to the signal level of the signal, and the gate potentials of the switches transit at the signal levels different from each other.

The signal levels for changing over between the open and closed states of the plurality of switches may be set such that the signal level increases toward the output terminal side.

The plurality of switches may have impedances which are equal to each other.

The plurality of switches may have impedances set such that the impedance increases toward the output terminal side.

A plurality of units individually including the resistor, short-circuiting controlling section and connection controlling section may be connected in series between the input and output terminals.

The resistor member provided between the output terminal and the reference potential may have a doubled resistance value with respect to a resistance value of the resistor connected between the input and output terminals.

The signal processing apparatus may further include an amplification section configured to amplify the signal outputted from the output terminal.

The signal processing apparatus may further include a control section configured to control the switches between the open and closed states based on the signal level of the signal.

Where the short-circuiting controlling section includes the plurality of switches, the control section may increase the number of those switches which are in an off state as the signal level of the signal increases.

The controlling section may increase the number of switches which are in an off state in proportion to the magnitude of the signal level of the signal.

Where the connection controlling section includes the plurality of switches, the control section may control the switches between the open and closed states such that the resistance value between the output terminal and the reference potential decreases as the signal level of the signal increases.

The control section may control the switches between the open and closed states such that the resistance value changes in inverse proportion to the magnitude of the signal level of the signal.

The control section may change over the switches disposed in parallel to each other between the open and closed states at the signal levels different by a predetermined level interval from each other.

According to another embodiment of the present technology, there is provided also a signal processing method for a signal processing apparatus, the method executed by the signal processing apparatus including monitoring a signal level of an inputted signal, determining a control signal value for each of a plurality of switches which are disposed in parallel to each other so as to configure at least one of a short-circuiting controlling section for controlling whether or not the input side of a resistor connected between an input terminal and an output terminal and the output terminal are to be short-circuited in response to the signal level of the signal inputted from the input terminal and a connection controlling section for controlling whether or not a resistor member is to be connected between the output terminal and a reference potential in response to the signal level of the signal and which change over between open and closed states at signal levels different from each other, and supplying the control signals to the switches.

According to a further embodiment of the present technology, there is further provided a communication apparatus including a reception section configured to receive a signal, an amplification section configured to amplify the signal, a short-circuiting controlling section configured to control whether or not the reception section side of a resistor connected between the reception section and the amplification section and the amplification section are to be short-circuited in response to a signal level of the signal, and a connection controlling section configured to control whether or not a resistor member is to be connected between the amplification section and a reference potential in response to the signal level of the signal, wherein at least one of the short-circuiting controlling section and the connection controlling section includes a plurality of switches which are disposed in parallel to each other and change over whether the opposite ends of the short-circuiting controlling section or the connection controlling section are to be connected to each other or are to be disconnected from each other at signal levels different from each other.

In the embodiment of the present technology, the signal level of a signal inputted is monitored. Then, a control signal value is determined for each of the switches which are disposed in parallel to each other so as to configure at least one of the short-circuiting controlling section for controlling whether or not the input side of the resistor connected between the input terminal and the output terminal and the output terminal are to be short-circuited in response to the signal level of the signal inputted from the input terminal and the connection controlling section for controlling whether or not the resistor member is to be connected between the output terminal and the reference potential in response to the signal level of the signal and which change over between the open and closed states at the signal levels different from each other. Then, the control signals are supplied to the switches.

With the signal processing apparatus and method and the communication apparatus of the present technology, the signal level can be controlled. Especially, the attenuation amount can be varied continuously while increase of the circuit scale and the power consumption is suppressed.

BRIEF DESCRIPTION OF THE DRAWINGS

FIG. 14 is a block diagram showing an example of principal components of a computer.

DETAILED DESCRIPTION OF THE PREFERRED EMBODIMENTS

In the following, preferred embodiments of the present disclosure are described with reference to the drawings. It is to be noted that the description is given in the following order.

1. First Embodiment (variable gain amplifier circuit)

2. Second Embodiment (reception apparatus)
3. Third Embodiment (display apparatus)
4. Fourth Embodiment (computer)

1. First Embodiment 1-1 Variable Attenuator

Figure 1:
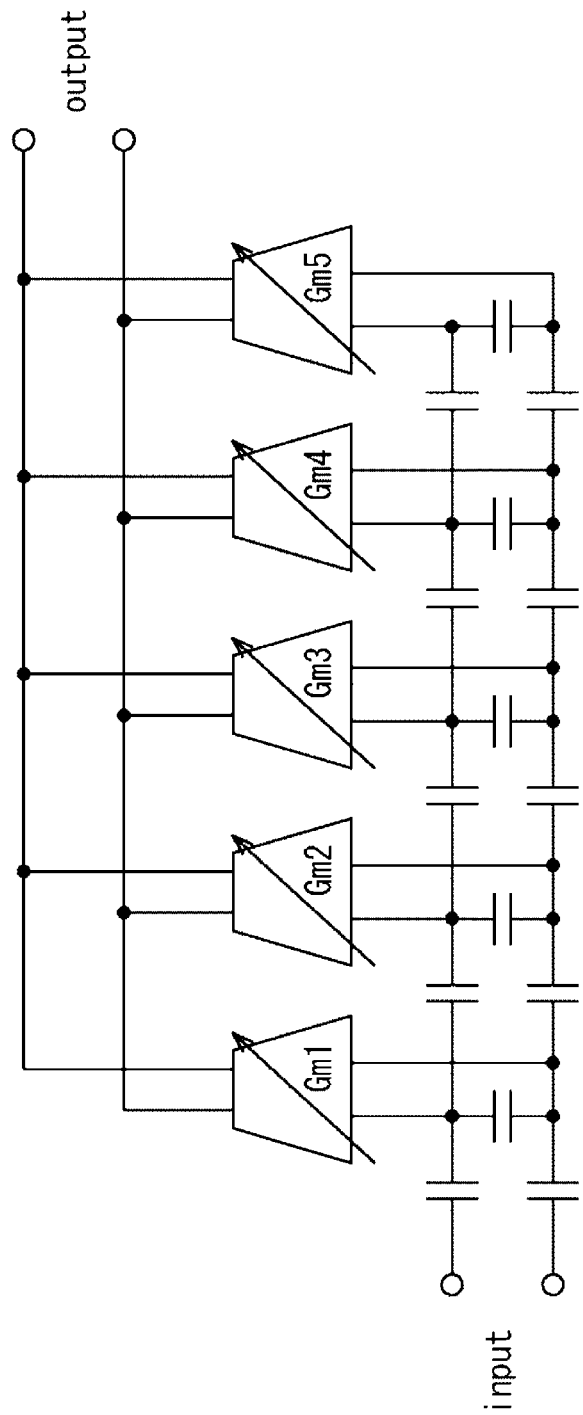
FIG. 1 is a circuit diagram showing an example of a configuration of a variable gain amplifier circuit.

FIG. 1 shows an example of a configuration of a variable gain amplifier circuit. The variable gain amplifier circuit shown in FIG. 1 is incorporated in an RF front end. In the variable gain amplifier circuit, a plurality of variable gain amplifiers are connected to each other through a capacitor attenuator. In the present variable gain amplifier circuit, when the input signal level is comparatively high, the signal attenuated by the capacitor attenuator at the input end is inputted to the amplifiers at the succeeding stages. This can implement improvement of a distortion characteristic which usually makes a problem.

However, since a plurality of stages of variable gain amplifier circuits are required as shown in FIG. 1, there is the possibility that a mounting area and power consumption of the IC (integrated circuit) may be comparatively increased. Further, also the parasitic capacitance of the input terminal or the output terminal is comparatively high, and specifically, there is the possibility that increase of the input capacitance at the input terminal may make a factor of degradation of the impedance matching characteristic at the input terminal.

Figure 2:
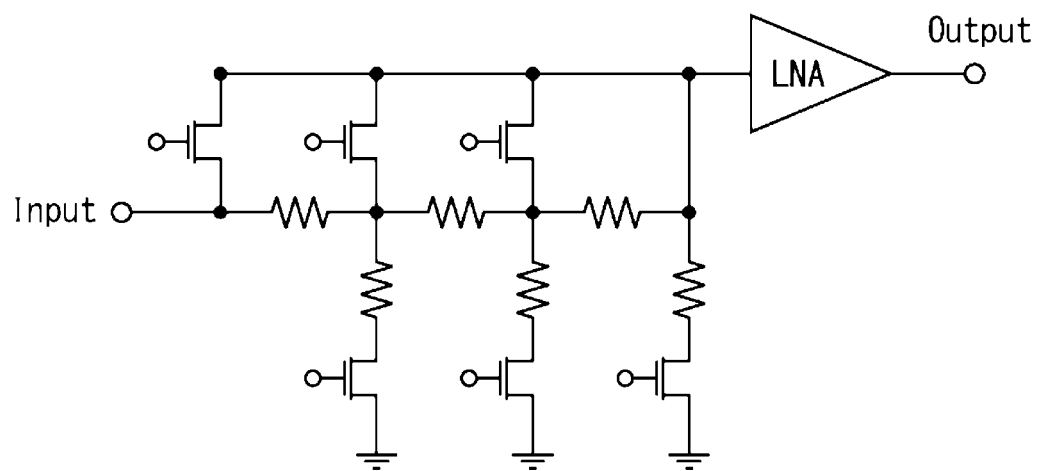
FIG. 2 is a circuit diagram showing another example of a configuration of a variable gain amplifier circuit.

FIG. 2 shows another example of a configuration of a variable gain amplifier circuit mounted at an RF front end. In the case of the variable gain amplifier circuit shown in FIG. 2, the gain thereof changes in response to selection of whether the gate potential of an MOS switch is set to the high level or the low level to change the attenuation value of a resistor attenuator configured from a resistor ladder.

Figure 3:
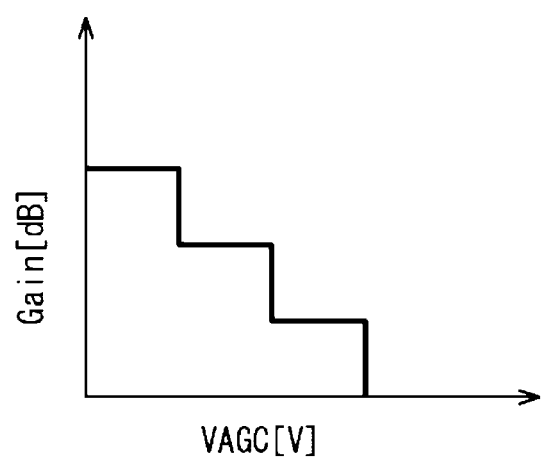
FIG. 3 is a diagrammatic view illustrating a gain controlling characteristic.

In the case of such a variable gain amplifier circuit as just described, there is the possibility that the gain controlling characteristic of the same may become a stepwise characteristic as seen from FIG. 3. This is because the gate potential of the MOS transistor for controlling the resistor attenuator shown in FIG. 2 is controlled in a switching manner between the high level and the low level. Therefore, if the gain varies in a stepwise fashion (and besides by a large amount in an instant), then also the signal level of a received analog video signal varies in an instant, resulting in the possibility that an instantaneous luminance variation may be observed on a display image.

Further, if it is assumed that, for example, one step in FIG. 3 is 3 dB, then the input signal amplitude to a succeeding stage circuit becomes a value higher by 3 dB in comparison with an alternative case wherein the gain is controlled continuously. Therefore, there is the possibility that the dynamic range may be degraded.

It is to be noted that, although it seems a promising configuration proposal to compensate for an instantaneous great variation of the gain value described above by a digital circuit at a succeeding stage in the system, there is the possibility that a digital circuit which is comparatively large in scale is required to be mounted, and the mounting area or the power consumption of the IC may therefore increase.

1-2 Signal Processing Apparatus

Therefore, the signal processing apparatus is configured such that it includes a short-circuiting controlling section configured to control whether or not the input side of a resistor connected between an input terminal and an output terminal and the output terminal are to be short-circuited in response to a signal level of a signal inputted from the input terminal, and a connection controlling section configured to control whether or not a resistor member is to be connected between the output terminal and a reference potential in response to the signal level of the signal, and that at least one of the short-circuiting controlling section and the connection controlling section includes a plurality of switches disposed in parallel to each other for changing over a state thereof between open and closed states at signal levels different from each other.

Where the signal processing apparatus is configured in this manner, the attenuation amount can be varied more continuously in response to the AGC voltage, and the so-called flutter resistance of suppressing short period fluctuations can be improved. Consequently, the necessity for a digital processing section for suppressing a sudden variation of the attenuation amount is eliminated. Therefore, increase of the circuit scale and the power consumption can be suppressed.

The signal processing apparatus may be configured such that the switches are individually configured from an MOS transistor whose gate potential varies in response to the signal level of the signal, and the gate potentials of the switches transit at the signal levels different from each other.

By using the MOS transistor in this manner, the configuration can be simplified further, and increase of the circuit scale and the power consumption can be suppressed further.

The signal levels for changing over between the open and closed states of the switches may be set such that the signal level increases toward the output terminal side.

By setting the signal levels in this manner, the switches can be short-circuited in order beginning with the switch on the input terminal side in response to the magnitude of the signal level, and the attenuation amount can be varied more continuously.

The switches may have impedances which are equal to each other.

By configuring the switches in this manner, the variation of the attenuation amount by short-circuiting of each switch can be equalized further.

The switches may have impedances set such that the impedance increases toward the output terminal side.

By configuring the switches in this manner, the gain of the short-circuited path on the input terminal side can be made dominant, and the attenuation amount can be varied further continuously.

A plurality of units individually including the resistor, short-circuiting controlling section and connection controlling section may be connected in series between the input and output terminals.

The resistor member provided between the output terminal and the reference potential may have a doubled resistance value with respect to a resistance value of the resistor connected between the input and output terminals. By configuring the resistor member in this manner, the signal level can be divided equally, and the variation of the attenuation amount by connection control of the resistors can be made further continuously.

The signal processing apparatus may further include an amplification section configured to amplify the signal outputted from the output terminal.

By configuring the signal processing apparatus in this manner, a variable gain amplifier circuit can be formed.

The signal processing apparatus may further include a control section configured to control the switches between the open and closed states based on the signal level of the signal.

By configuring the signal processing apparatus in this manner, the control of the attenuation amount based on the signal level can be carried out in the apparatus, and the variation of the attenuation amount can be made continuous more readily.

It is to be noted that the present technology can be implemented also as a signal processing method for the signal processing apparatus.

Further, the signal processing apparatus may be configured as a communication apparatus including a reception section configured to receive a signal, an amplification section configured to amplify the signal, a short-circuiting controlling section configured to control whether or not the reception section side of a resistor connected between the reception section and the amplification section and the amplification section are to be short-circuited in response to a signal level of the signal, and a connection controlling section configured to control whether or not a resistor member is to be connected between the amplification section and a reference potential in response to the signal level of the signal, wherein at least one of the short-circuiting controlling section and the connection controlling section includes a plurality of switches which are disposed in parallel to each other and change over whether the opposite ends of the short-circuiting controlling section or the connection controlling section are to be connected to each other or are to be disconnected from each other at signal levels different from each other.

In short, the present technology can be implemented as a signal processing apparatus and can be implemented also as an arbitrary apparatus which carries out similar signal processing. Further, the controlling process may be implemented partly or entirely by software.

In the following, more detailed description is given.

1-3 Variable Gain Amplifier Circuit

Figure 4:
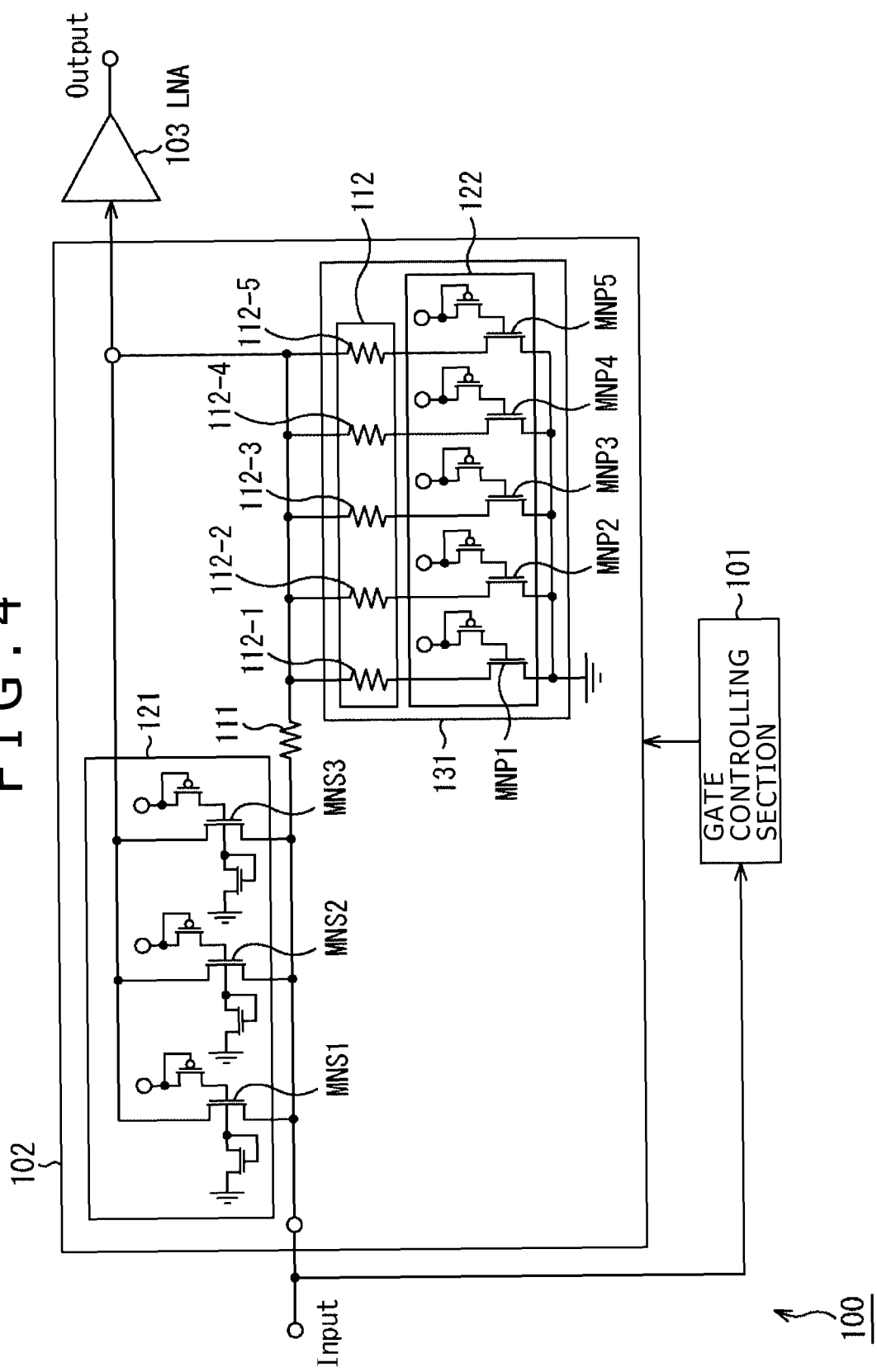
FIG. 4 is a circuit diagram showing an example of principal components of a variable gain amplifier circuit.

FIG. 4 shows an example of principal components of the variable gain amplifier circuit. The variable gain amplifier circuit shown in FIG. 4 is an example of a signal processing apparatus having an amplification function of amplifying a signal inputted thereto and can change the gain in response to the signal level of the input signal.

Referring to FIG. 4, the variable gain amplifier circuit 100 shown includes a gate controlling section 101, a variable attenuator 102 and a low noise amplifier (LNA) 103. The gate controlling section 101 controls the gate potential of transistors of the variable attenuator 102 in response to a signal level of a signal inputted thereto from an input terminal Input. The variable attenuator 102 attenuates the signal level of a signal inputted from the input terminal Input in response to the signal level so that occurrence of distortion by amplification of the LNA 103 may be suppressed. The LNA 103 amplifies the signal attenuated suitably by the variable attenuator 102.

The variable attenuator 102 is configured from a resistor attenuator which attenuates the signal level using a resistor ladder. The variable attenuator 102 includes a resistor 111 connected in series between the input and output terminals, and a resistor member 112 connected between the output terminal and a reference potential such as, for example, the ground potential GND.

Although the ratio in resistance value between the resistor 111 and the resistor member 112 is selected arbitrarily, if it is set, for example, to 1:2, then the signal level can be divided uniformly.

The variable attenuator 102 further includes a short-circuiting controlling section 121 for short-circuiting the input side of the resistor 111 and the output terminal of the variable attenuator 102, and a connection controlling section 122 for controlling whether or not the resistor member 112 is to be connected between the output terminal and the reference potential such as the ground potential GND. It is to be noted that the resistor member 112 and the connection controlling section 122 may be configured collectively as a connection controlling section 131.

The short-circuiting controlling section 121 includes a plurality of MOS (Metal Oxide Semiconductor) transistors disposed in parallel. In the case of the example of FIG. 4, the short-circuiting controlling section 121 includes three MOS transistors MNS1, MNS2 and MNS3. The resistor member 112 includes a plurality of resistors connected in parallel. In the case of the example of FIG. 4, the resistor member 112 includes five resistors 112-1 to 112-5. The connection controlling section 122 includes a plurality of MOS transistors disposed in parallel. In the case of the example of FIG. 4, the connection controlling section 122 includes five MOS transistors MNP1 to MNP5. The resistor member 112 and the connection controlling section 122 are connected in series between the output terminal of the variable attenuator 102 and the reference potential. In short, as shown in FIG. 4, the resistors which configure the resistor member 112 are connected in series to the MOS transistors which configure the connection controlling section 122.

Figure 5:
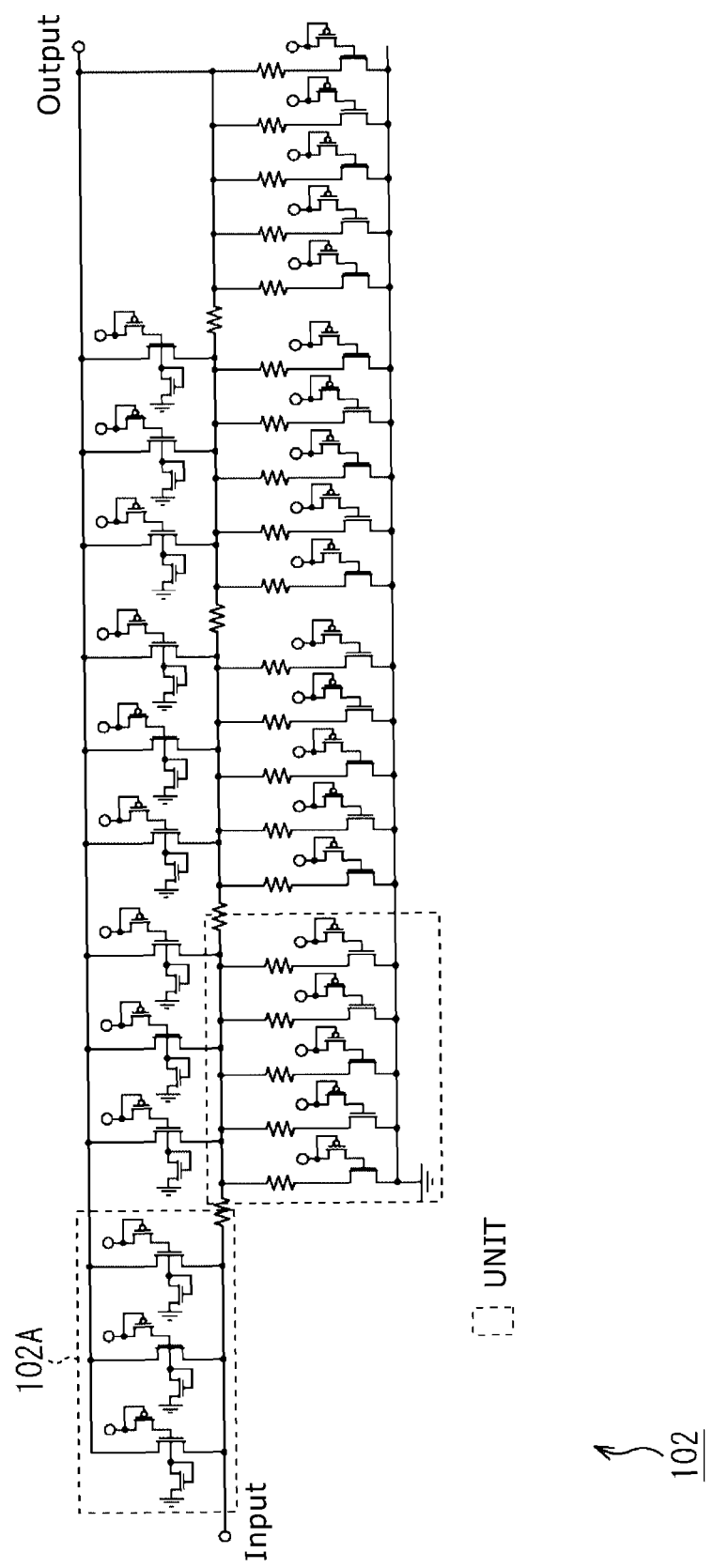
FIG. 5 is a circuit diagram showing an example of a variable attenuator.

It is to be noted that the variable attenuator 102 may be configured such that a plurality of units each formed from the configuration shown in FIG. 4 are connected in series between the input and output terminals as in an example shown in FIG. 5. In other words, the variable attenuator 102 may be configured from multiple stages of R-2R resistor ladders. In the example of FIG. 5, a unit 102A surrounded by a broken line corresponds to the configuration shown in FIG. 4.

Now, the short-circuiting controlling section 121 and the connection controlling section 122 are described.

The MOS transistors of the short-circuiting controlling section 121 and the connection controlling section 122 operate as switches which change over between open and closed states in response to the gate potential.

For example, the MOS transistors MNS1 to MNS3 exhibit an ON state when the gate potential has the H level and short-circuit the input side of the resistor 111 and the output terminal of the variable attenuator 102. Further, the MOS transistors MNS1 to MNS3 exhibit an OFF state when the gate potential has the L level and disconnects the input side of the resistor 111 and the output terminal of the variable attenuator 102.

Similarly, for example, the MOS transistor MNP1 exhibits an ON state when the gate potential has the H level and connects one of the terminals of the resistor 112-1 connected at the other terminal thereof to the output terminal of the variable attenuator 102 to a reference potential. However, when the gate potential has the L level, the MOS transistor MNP1 exhibits an OFF state and disconnects the resistor 112-1 and the reference potential from each other. Also the MOS transistors MNP2 to MNP5 operate similarly. In particular, each of the MOS transistors MNP2 to MNP5 connects or disconnects a resistor corresponding thereto, namely, a corresponding one of the resistors 112-2 to 112-5, the output terminal of the variable attenuator 102 and the reference potential to or from each other.

The gate potentials are controlled by the gate controlling section 101. In particular, the gate controlling section 101 controls the gate potentials in such a manner as illustrated, for example, in a graph shown in FIG. 6 in response to the signal level of a signal inputted to the variable gain amplifier circuit 100, namely, to a gain controlling voltage also called AGC voltage.

Figure 6:
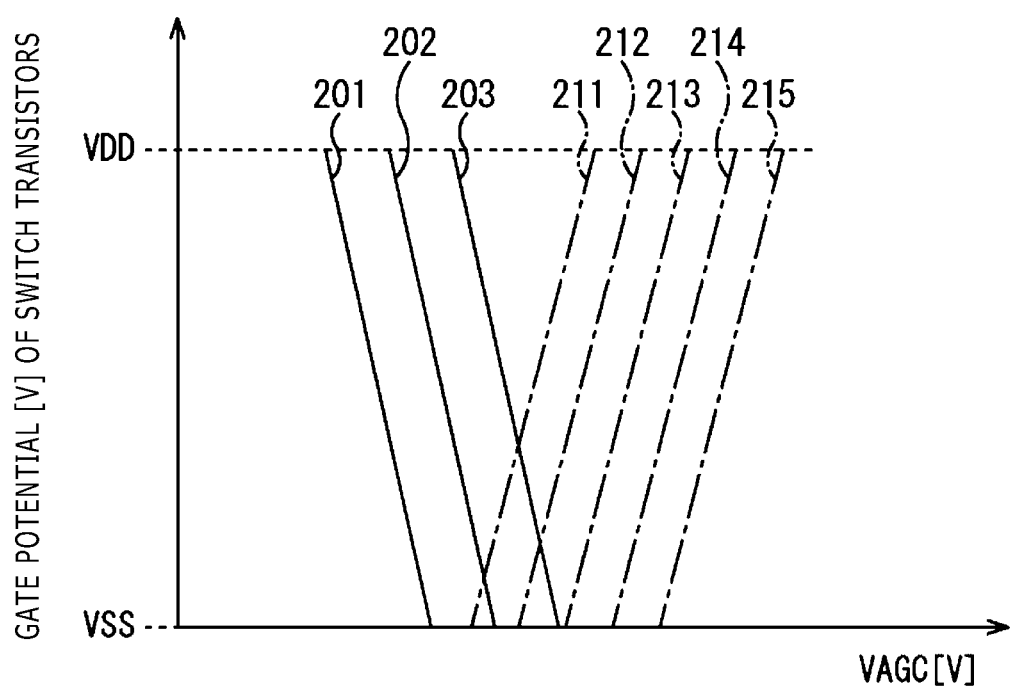
FIG. 6 is a diagrammatic view illustrating a gate voltage characteristic with respect to a signal level.

FIG. 6 illustrates a gate voltage characteristic with respect to a signal level. In the graph shown in FIG. 6, a line 201 illustrates an example of a manner of transition of the gate potential of the MOS transistor MNS1. Similarly, another line 202 indicates an example of a manner of transition of the gate potential of the MOS transistor MNS2, and a further line 203 indicates an example of a manner of transition of the gate potential of the MOS transistor MNS3.

It is to be noted that, in FIG. 6, only those portions of the gate potential which transit between a potential VDD and another potential VSS. Actually, the gate potential of each of the MOS transistors MNS1 to MNS3 maintains the potential VDD within the range within which the signal level VAGC is lower than the potential within the transition range and maintains the potential VSS within the range within which the signal level VAGC is higher than the potential within the transition range. For example, if the signal level VAGC is checked in a direction from a low portion to a high portion of the signal level VAGC, then the gate potential of the MOS transistor MNS1 transits from the potential VDD to the potential VSS at a predetermined signal level as can be seen from the line 201. This similarly applies also to the other MOS transistors MNS2 and MNS3.

The gate potentials of the MOS transistors MNS1 to MNS3 are controlled such that they transit at signal levels VAGC different from one another as seen in FIG. 6. In other words, an offset of a predetermined signal level interval is provided between different ones of the signal levels VAGC at which the gate potentials of the MOS transistors MNS1 to MNS3 transit.

Accordingly, in the short-circuiting controlling section 121, the number of those MOS transistors which are placed into an on state increases as the signal level decreases, but the number of those MOS transistors which are placed into an off state increases as the signal level increases. In other words, the gate controlling section 101 decreases the number of those MOS transistors which are in a short-circuited state in proportion to the signal level. By such control of the gate controlling section 101, the fluctuation of the attenuation amount can be made continuous.

Further, in the graph shown in FIG. 6, a line 211 indicates an example of a manner of transition of the gate potential of the MOS transistor MNP1. Similarly, lines 212 to 215 illustrates an example of a manner of transition of the gate potentials of the MOS transistors MNP2 to MNP5.

It is to be noted that FIG. 6 illustrates the gate potentials only within a region within which they transit between the potential VDD and the potential VSS. Actually, the gate potentials of the MOS transistors MNP1 to MNP5 maintain the potential VSS within a region within which the signal level VAGC is lower than that in the transition region but maintain the potential VDD within another region within which the signal level VAGC is higher than that in the transition range.

The gate potentials of the MOS transistors MNP1 to MNP5 are controlled such that they transit at signal levels VAGC different from one another as seen in FIG. 6. In particular, the signal levels VAGC at which the gate potentials of the MOS transistors MNP1 to MNP5 transit have offsets provided at predetermined signal level intervals from each other.

Accordingly, in the connection controlling section 122, the number of those MOS transistors which are placed into an off state increases as the signal level decreases, but the number of those MOS transistors which are placed into an on state increases as the signal level increases. In other words, the gate controlling section 101 changes the resistance value between the output terminal and the reference potential in inverse proportion to the signal level. By such control, the fluctuation of the attenuation amount can be made continuous.

Here, operation of the MOS transistors MNS1 to MNS3 is described paying attention to a distortion characteristic. In a process in which the gate potential of the MOS transistor MNS1 is controlled, a region in which the rate of change of the on resistance with respect to the drain-source potential is high exists. For example, if a case in which the MOS transistors MNS2 and MNS3 are not connected to the circuit is assumed, then since the present circuit exhibits a variation of the attenuation amount in response to an input signal amplitude in the region described above, the nonlinearity is comparatively high.

In contrast, in the region described above, the gate potentials of the MOS transistors MNS2 and MNS3 become equal to the potential VDD thereby to establish an operation region in which the drain and the source of the MOS transistor MNS1 are short-circuited. Therefore, also in a region in which the rate of change of the on-resistance with respect to the drain-source potential difference of the MOS transistor MNS1 is high, the linearity of the present circuit maintains a comparatively high value because the attenuation amount depends generally upon the on-resistance of the MOS transistors MNS2 and MNS3. From similar operation, the nonlinearity of the MOS transistor MNS2 is suppressed by the MOS transistor MNS3, and the nonlinearity of the MOS transistor MNS3 is suppressed by the switch group of the succeeding stage because the succeeding switch groups are in a short-circuited operation region.

In contrast, as regards the linearity of the MOS transistors MNP1 to MNP5, since the gate controlling voltages of the transistors are controlled with the offsets provided therebetween, the MOS transistors MNP1 to MNP5 do not operate at the same time in a bias region in which the rate of change of the drain-source resistance with respect to the drain-source potential of each transistor is high.

Referring to FIG. 5, the variable attenuator 102 can be configured as a multistage R-2R attenuator, and it can be expected that the input and output impedances upon attenuation operation are held to a comparatively fixed value. Specifically, since, upon attenuation operation, the output impedance of the variable attenuator 102 becomes part of a feedback path of the LNA 103 on the succeeding stage, as it comes to have a value proximate to the signal source impedance, which is, for example, in the case of a TV system, 75 ohm, the feedback factor of the LNA 103 is held fixed. Therefore, it is possible to prevent the distortion characteristic of the LNA 103 from being degraded.

Further, since also the input impedance upon AGC operation does not vary by a great amount due to the R-2R configuration, it is expected that the return loss characteristic which is an important index to a wireless device is maintained also upon AGC operation.

Figure 7:
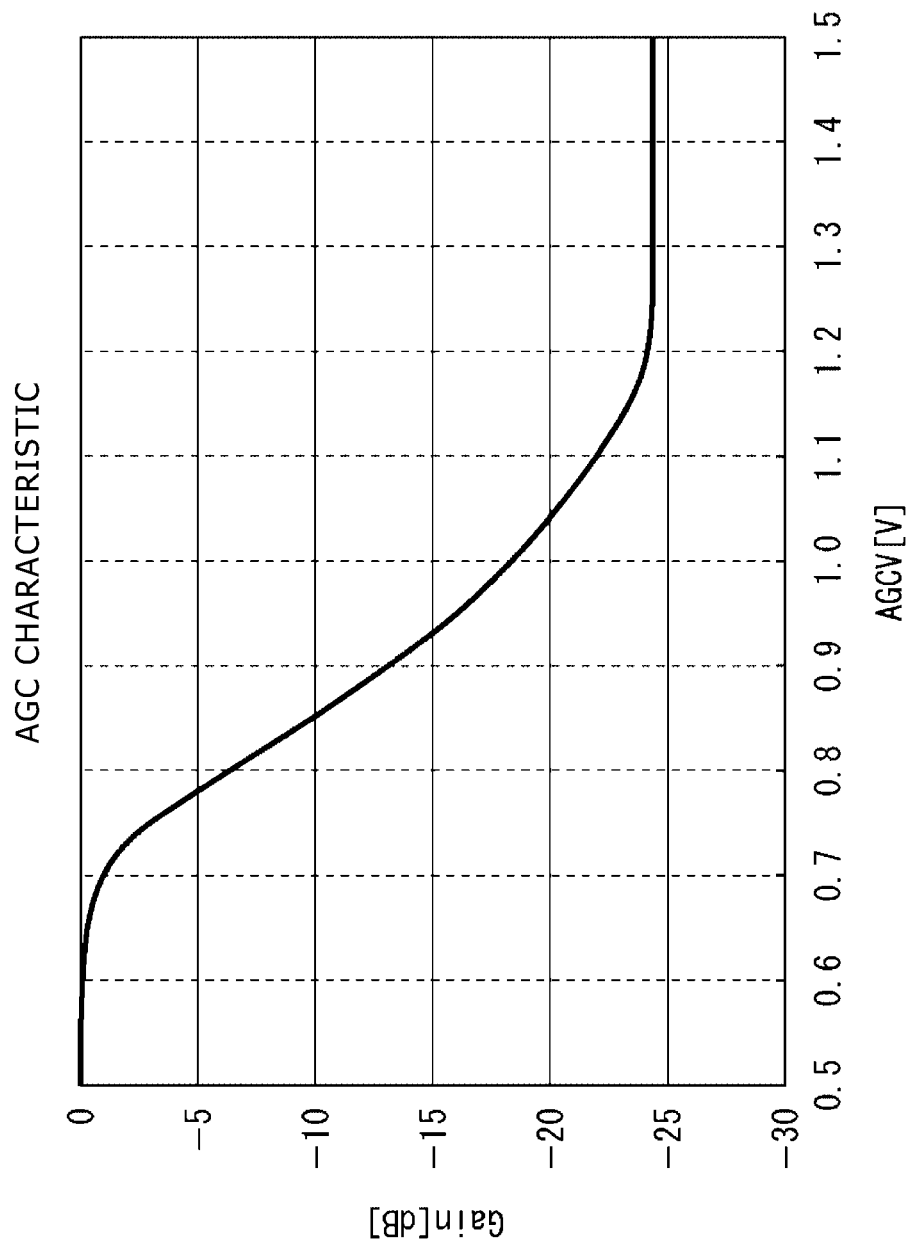
FIG. 7 is a diagrammatic view illustrating an AGC (Automatic Gain Control) characteristic.

FIG. 7 illustrates an AGC characteristic of the variable attenuator 102. As seen in FIG. 7, the attenuation amount can be varied continuously with respect to the AGC voltage. Accordingly, also the flutter resistance which is a problem in the circuit in the past of FIG. 2 does not become a problem, and besides, the necessity for the logic circuit for carrying out correction on a succeeding stage is eliminated. In other words, the variable gain amplifier circuit 100 can continuously vary the attenuation amount while it suppresses increase of the circuit scale and the power consumption.

Figure 8:
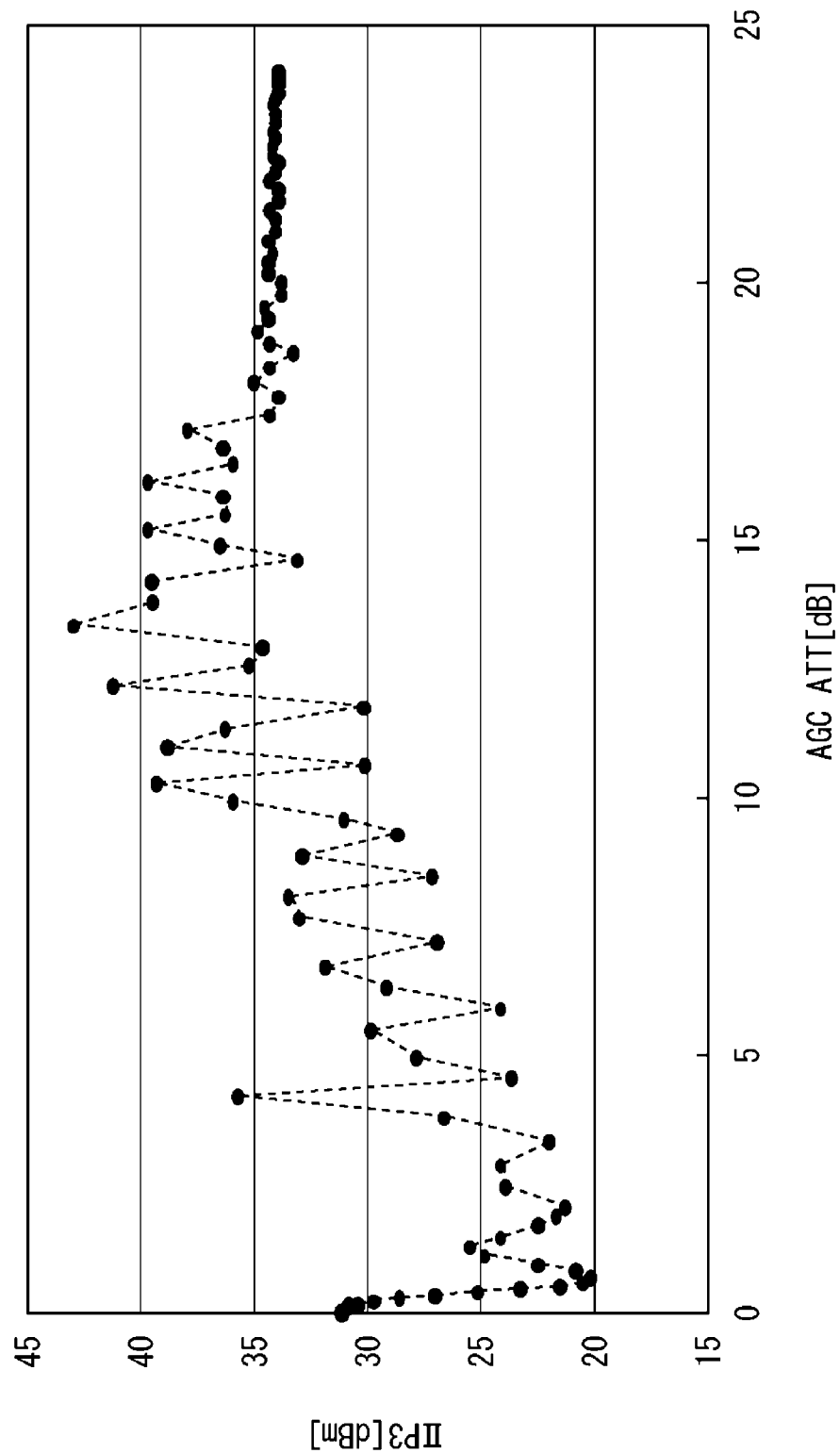
FIG. 8 is a diagrammatic view illustrating a third-order distortion characteristic.
Figure 9:
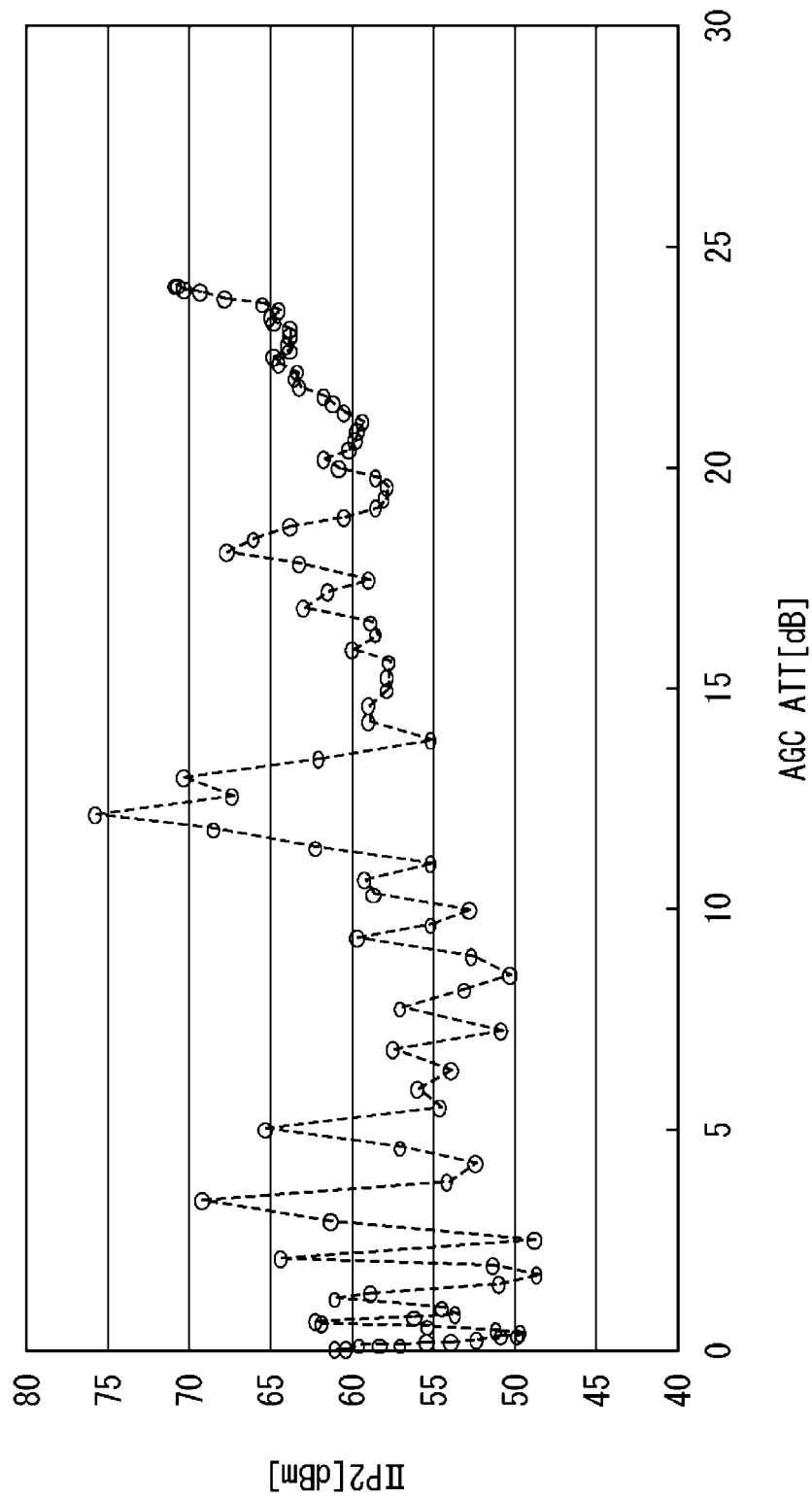
FIG. 9 is a diagrammatic view illustrating a second-order distortion characteristic.

FIG. 8 illustrates a third-order distortion characteristic of the variable attenuator 102, and FIG. 9 illustrates a second-order distortion characteristic of the variable attenuator 102. As seen from FIGS. 8 and 9, both characteristics represent that the variable attenuator 102 operates while maintaining a comparatively high linearity.

Figure 10:
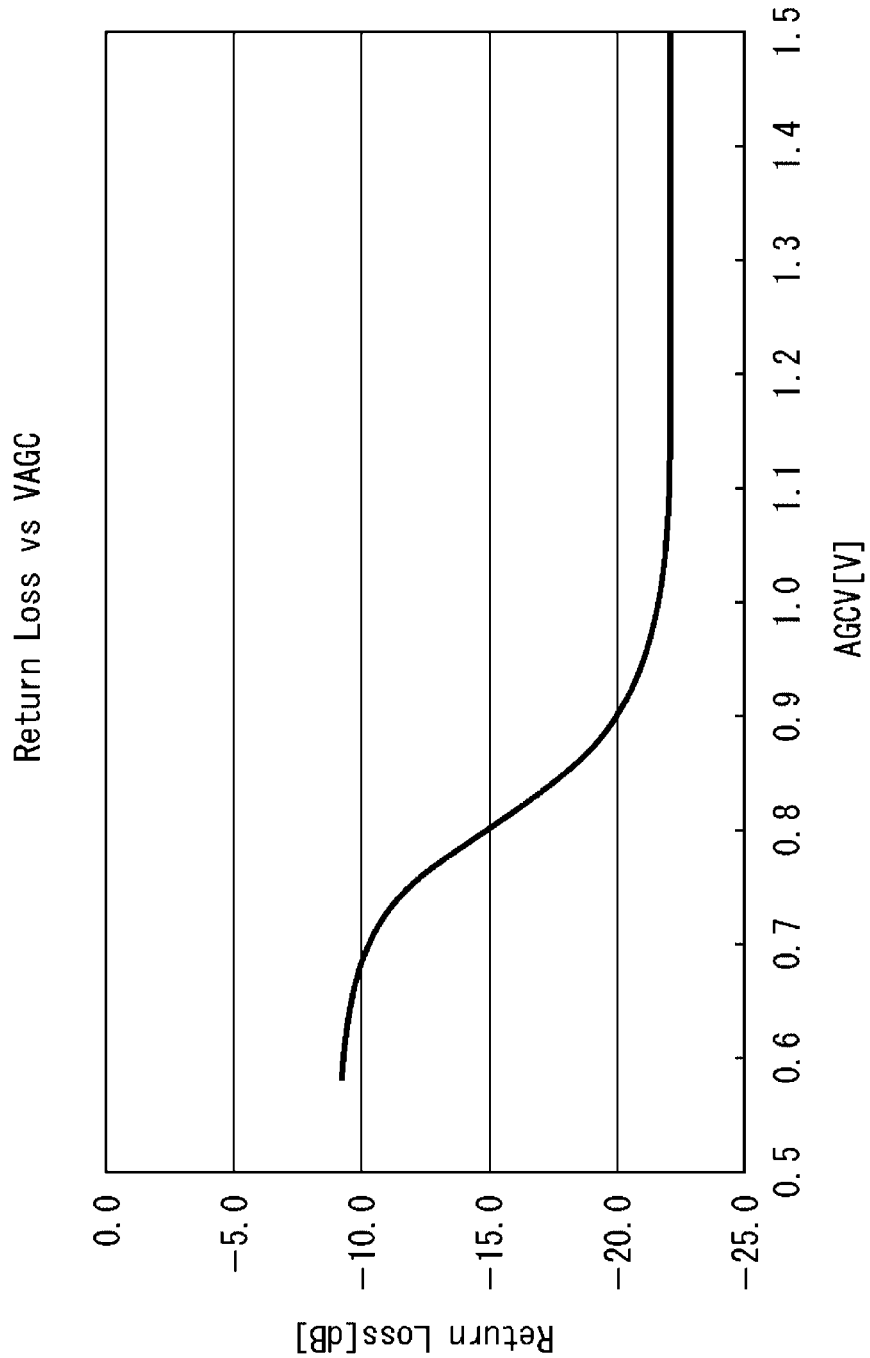
FIG. 10 is a diagrammatic view illustrating an entrance return loss characteristic.

FIG. 10 illustrates an input return loss characteristic of the variable attenuator 102. It can be recognized from FIG. 10 that, also upon AGC operation, a return loss characteristic can be assured.

In this manner, since the signal levels at which the gate potentials of a plurality of MOS transistors transit are set such that the nearer to the output side the MOS transistor, the higher the gate potential, the MOS transistors can be short-circuited in order beginning with the MOS transistor on the input side in response to the magnitude of the signal level. Consequently, the attenuation amount can be varied continuously.

The variable attenuator 102 can be configured only from poly resistors and MOS transistors as shown in FIG. 4. Accordingly, it is considered that also the affinity of the variable attenuator 102 with an advanced MOS process is comparatively high and the variable attenuator 102 is comparatively small in scale. For example, an equivalent function can be implemented with a layout area of, for example, approximately 1/20 that of the circuit of FIG. 1 which is an existing circuit. Further, since the power is consumed only by the control circuit due to the circuit configuration of the variable attenuator 102, the power consumption can be suppressed comparatively low. Accordingly, the variable gain amplifier circuit 100 can reduce the cost in fabrication and driving.

It is to be noted that the number of MOS transistors in each of the short-circuiting controlling section 121 and the connection controlling section 122 may be an arbitrary number only if it is a plural number. Although the variation of the attenuation amount can be made more continuously and smoothly by increasing the number of MOS transistors, there is the possibility that the circuit scale and the power consumption may increase as much.

Further, the impedances of the MOS transistors may be equal to each other or may be made different from each other such that the switch nearer to the output side has a higher impedance. Where the impedances of the MOS transistors are equal to each other, the variation of the attenuation amount by short-circuiting of the switches can be further equalized. Meanwhile, where the impedances of the MOS transistors are made different from each other, the gain of a short-circuited path on the input side can be made dominant, and the attenuation amount can be varied more continuously.

Further, in the short-circuiting controlling section 121 and the connection controlling section 122, the intervals or offsets of the AGC voltage at which the gate potentials of the MOS transistors transit may be set arbitrarily and need not be a fixed interval as described hereinabove.

1-4 Flow of the Gate Controlling Process

Figure 11:
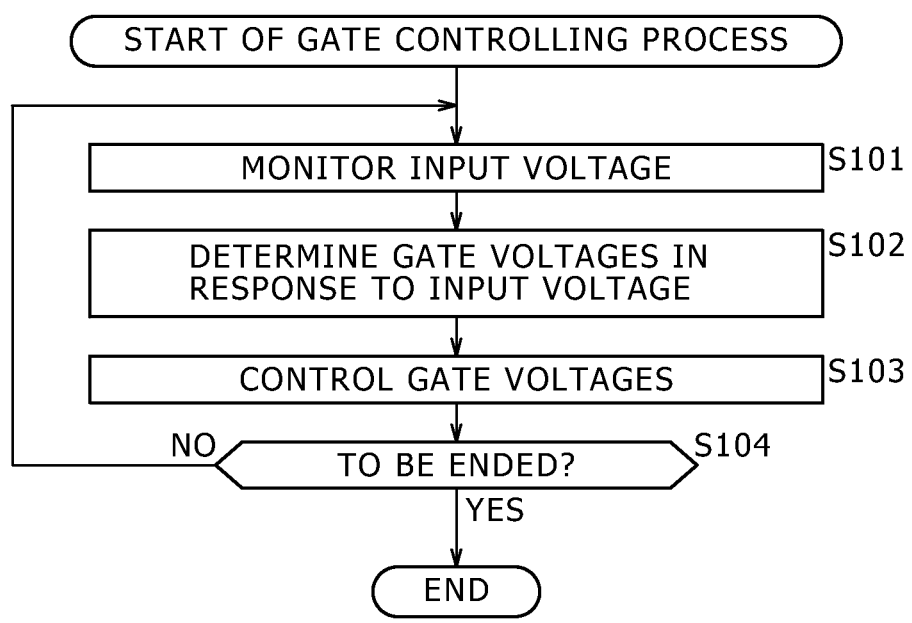
FIG. 11 is a flow chart illustrating an example of a flow of a gate controlling process.

Now, an example of a flow of a gate controlling process executed by the gate controlling section 101 is described with reference to a flow chart of FIG. 11.

After a gate controlling process is started, the gate controlling section 101 monitors the input voltage at step S101.

Then, the gate controlling section 101 determines a gate voltage for each MOS transistor in response to the input voltage at step S102 and then controls the gate voltages at step S103.

At step S104, the gate controlling section 101 determines whether or not the gate controlling process is to be ended. If it is determined that the gate controlling process is not to be ended, then the processing returns to step S101 so that the processes at the steps beginning with step S101 are repeated. On the other hand, if it is determined at step S104 that the gate controlling process is to be ended, then the gate controlling section 101 ends the gate controlling process.

Since the ate controlling section 101 executes such a controlling process as described above, the variable gain amplifier circuit 100 can vary the attenuation amount continuously while it suppresses increase of the circuit scale and the power consumption.

2. Second Embodiment

Figure 12:
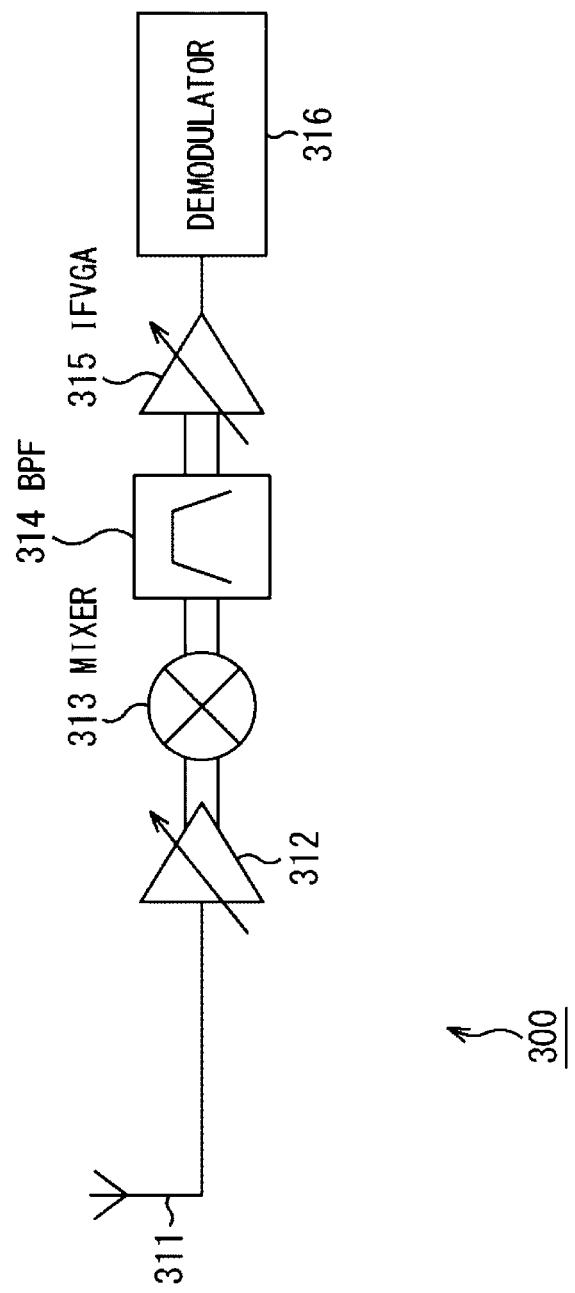
FIG. 12 is a block diagram showing an example of principal components of a reception apparatus.

It is to be noted that the present technology can be applied to an arbitrary apparatus which has a function similar to that of the variable gain amplifier circuit 100 of FIG. 4. For example, the present technology can be applied to a reception apparatus which uses the variable gain amplifier circuit 100. FIG. 12 shows an example of principal components of the reception apparatus.

The reception apparatus 300 shown in FIG. 12 receives a broadcasting wave, for example, of a TV signal. Referring to FIG. 12, the reception apparatus 300 includes an antenna 311, a variable gain amplifier (AMP) 312, a mixer 313, a band-pass filter (BPF) 314, another variable gain amplifier (IFVGA) 315 and a demodulation section (DEMODULATOR) 316.

In such a reception apparatus 300 as described just above, the variable gain amplifier circuit 100 of FIG. 4 is applied as the variable gain amplifier 312. By the application of the variable gain amplifier circuit 100, the variable gain amplifier 312 can control the gain in response to the signal level of a reception signal such as, for example, a TV signal received by the antenna 311. Accordingly, the variable gain amplifier 312 can amplify the reception signal while suppressing distortion.

Thereupon, the variable gain amplifier 312 can vary the attenuation amount continuously as described hereinabove. In particular, since the variable gain amplifier 312 has a high flutter resistance, for example, when the reception signal includes an image signal like a TV signal, the reception apparatus 300 can suppress picture quality degradation of a display image thereof.

Further, by applying the variable gain amplifier circuit 100 as the variable gain amplifier 312, increase of the circuit scale or the power consumption can be suppressed. Consequently, the variable gain amplifier circuit 100 can reduce the cost for fabrication and driving.

It is to be noted that the signal received by the reception apparatus 300 may be a wireless signal or may be a wired signal.

The present technology can be applied also to other apparatus.

3. Third Embodiment

Display Apparatus

Figure 13:
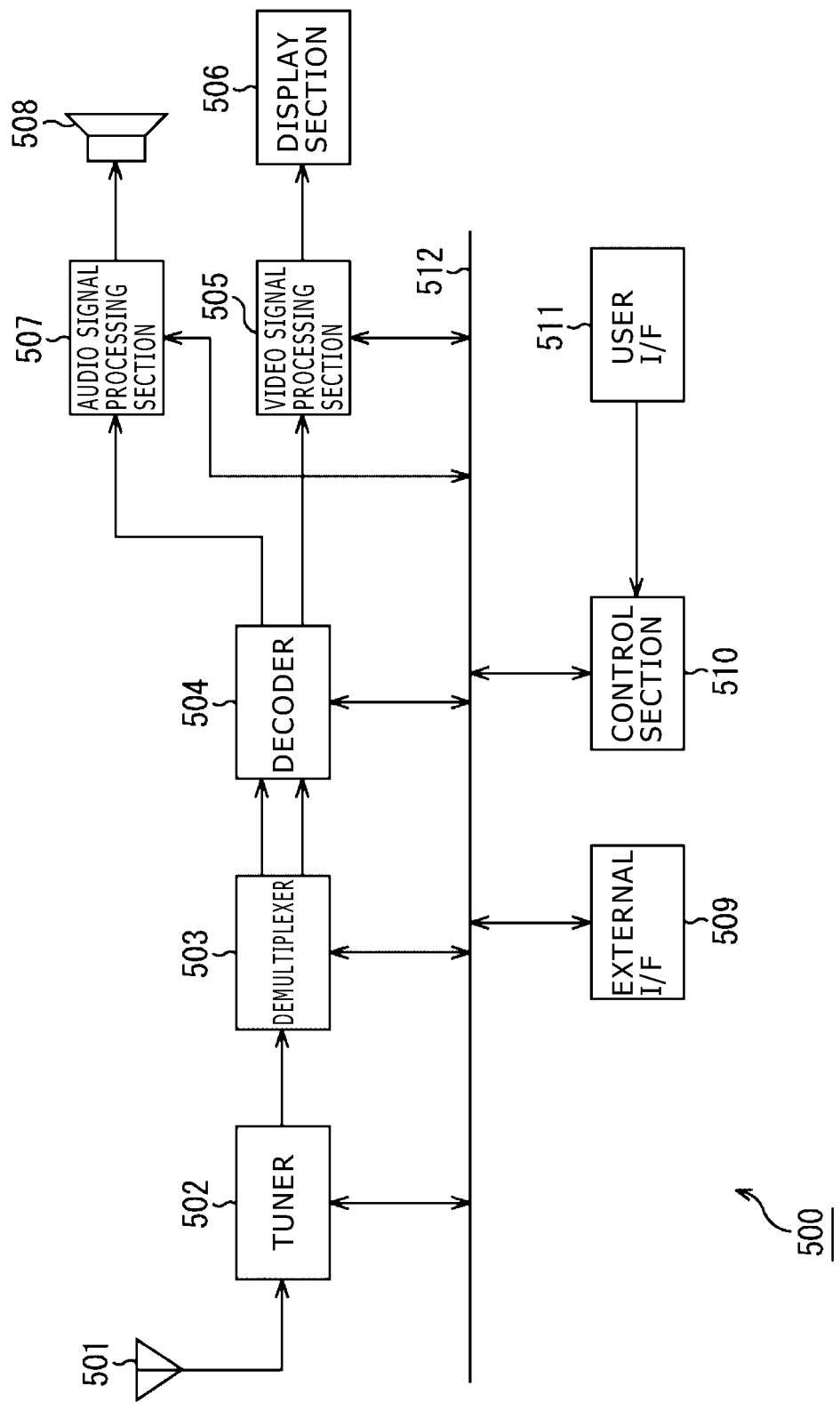
FIG. 13 is a block diagram showing an example of principal components of a display apparatus.

FIG. 13 is a block diagram showing an example of principal components of a display apparatus wherein such a reception apparatus as described above, namely, the reception apparatus 300, is used as a processing section. The display apparatus 500 shown in FIG. 13 is a reception apparatus which receives an AM modulate broadcasting wave such as, for example, a television signal of the SECAM-L standards and also an apparatus which displays a received image. Referring to FIG. 13, the display apparatus 500 includes, for example, an antenna 501, a tuner 502, a demultiplexer 503, a decoder 504, a video signal processing section 505, a display section 506, an audio signal processing section 507, a speaker 508, an external interface 509, a control section 510, a user interface 511 and a bus 512.

The tuner 502 extracts a signal of a desired channel from among broadcasting signals received through the antenna 501 and demodulates the extracted signal. Then, the tuner 502 outputs a coded bit stream obtained by the demodulation to the demultiplexer 503. Thus, the tuner 502 plays a role as a transmission section in the display apparatus 500 which receives a coded stream in which an image is encoded.

The demultiplexer 503 demultiplexes a video stream and an audio stream of a program of an object of viewing from the coded bit stream and outputs the demultiplexed streams to the decoder 504. Further, the demultiplexer 503 extracts auxiliary data such as an EPG (Electronic Program Guide) from the coded bit stream and supplies the extracted data to the control section 510. It is to be noted that, if the coded bit stream is in a scrambled state, then the demultiplexer 503 may carry out descrambling.

The decoder 504 decodes the video stream and the audio stream inputted thereto from the demultiplexer 503. Then, the decoder 504 outputs video data generated by the decoding process to the video signal processing section 505. Further, the decoder 504 outputs audio data generated by the decoding process to the audio signal processing section 507.

The video signal processing section 505 reproduces the video data inputted thereto from the decoder 504 and controls the display section 506 to display a video. Further, the video signal processing section 505 may control the display section 506 to display an application screen image supplied thereto from a network. Furthermore, the video signal processing section 505 may carry out an additional process such as, for example, noise cancellation for the video data in accordance with a setting thereto. Further, the video signal processing section 505 generates an image of a GUI (Graphical User Interface) such as, for example, a menu, a button or a cursor and controls the display section 506 to display the generated image in a superposed relationship with the output image.

The display section 506 is driven by a driving signal supplied thereto from the video signal processing section 505 and displays a video or image on an image plane of a display device such as, for example, a liquid crystal display device, a plasma display device or an OELD (Organic Electro Luminescence Display; organic EL display) device.

The audio signal processing section 507 carries out a reproduction process such as D/A conversion and amplification for the audio data inputted thereto from the decoder 504 and controls the speaker 508 to output sound. Further, the audio signal processing section 507 may carry out an additional process such as noise cancellation for the audio data.

The external interface 509 connects the display apparatus 500 to an external apparatus or a network. For example, a video stream or an audio stream received through the external interface 509 may be decoded by the decoder 504. In other words, also the external interface 509 plays a role as a transmission section of the display apparatus 500 for receiving a coded stream in which an image is encoded.

The control section 510 includes a processor such as a CPU (central processing unit) and a memory such as a RAM (random access memory) or a ROM (read only memory). The memory stores therein a program to be executed by the CPU, program data, EPG data, data acquired through the network and so forth. The program stored in the memory is read into and executed by the CPU, for example, upon starting of the display apparatus 500. The CPU executes the program to control operation of the display apparatus 500 in response to an operation signal inputted thereto, for example, from the user interface 511.

The user interface 511 is connected to the control section 510. The user interface 511 includes, for example, buttons and switches for being operated by the user to operate the display apparatus 500, a reception section for a remote control signal and so forth. The user interface 511 detects an operation of the components by the user to generate an operation signal and outputs the generated operation signal to the control section 510.

The bus 512 connects the tuner 502, demultiplexer 503, decoder 504, video signal processing section 505, audio signal processing section 507, external interface 509 and control section 510 to each other.

The reception apparatus 300 described hereinabove is used for the antenna 501 and the tuner 502 of the display apparatus 500 configured in such a manner as described above. Accordingly, the display apparatus 500 can vary the attenuation amount continuously while suppressing increase of the circuit scale and the power consumption. As a result, picture quality degradation of the display image can be suppressed.

4. Fourth Embodiment

Computer

While the series of processes described above can be executed by hardware, it may otherwise be executed by software. In the case where the series of processes is executed by software, a program which constructs the software is installed into a computer. The computer here may be an computer incorporated in hardware for exclusive use, a personal computer for universal use which can execute various functions by installing various programs into the personal computer or the like.

FIG. 14 is a block diagram showing an example of a hardware configuration of a computer which executes the series of processes described hereinabove in accordance with a program.

Referring to FIG. 14, in the computer 600 shown, a CPU 601, a ROM 602 and a RAM 603 are connected to one another by a bus 604.

Also an input/output interface 610 is connected to the bus 604. An inputting section 611, an outputting section 612, a storage section 613, a communication section 614 and a drive 615 are connected to the input/output interface 610.

The inputting section 611 includes, for example, a keyboard, a mouse, a microphone, a touch panel, an input terminal and so forth. The outputting section 612 includes, for example, a display unit, a speaker, an output terminal and so forth. The storage section 613 is formed, for example, from a hard disk, a RAM disk, a nonvolatile memory or the like. The communication section 614 is formed, for example, from a network interface. The drive 615 drives a removable medium 621 such as a magnetic disk, an optical disk, a magneto-optical disk or a semiconductor memory.

In the computer configured in such a manner as described above, the CPU 601 loads a program stored, for example, in the storage section 613 into the RAM 603 through the input/output interface 610 and the bus 604 and executes the program to carry out the series of processes described above. Into the RAM 603, also data and so forth necessary for the CPU 601 to execute various processes are stored suitably.

The program to be executed by the computer, namely, by the CPU 601, can be recorded on and provided as a removable medium 621 as, for example, a package medium. Or, the program can be provided through a wired or wireless transmission medium such as a local area network, the Internet or a digital satellite broadcast.

The computer can install the program into the storage section 613 through the input/output interface 610 by loading the removable medium 621 into the drive 615. Further, the program can be received by the communication section 614 through a wired or wireless transmission medium and installed into the storage section 613. Also it is possible to install the program in advance in the ROM 602 or the storage section 613.

It is to be noted that the program to be executed by the computer may be of the type wherein the processes are carried out in a time series in the order as described in the present specification or of the type wherein the processes are executed in parallel or executed individually at necessary timings such as when the process is called.

It is to be noted that, in the present specification, the steps which describe the program recorded in a recording medium may be but need not necessarily be processed in a time series in the order as described, and include processes which are executed in parallel or individually without being processed in a time series.

Further, in the present specification, the term "system" is used to represent an aggregation composed of a plurality of components such as devices, modules or parts and all components may or may not be accommodated in the same housing. Accordingly, a plurality of apparatus accommodated in separate housings and connected to each other through a network configure a system, and also one apparatus wherein a plurality of modules are accommodated in a single housing configures a system.

Further, the configuration described as one apparatus or one processing section in the foregoing description may be divided so as to configure a plurality of apparatus or processing sections. Or conversely, the configurations described as a plurality of apparatus or processing sections in the foregoing description may be put together so as to configure a single apparatus or processing section. Further, any apparatus or processing section described hereinabove may naturally include a configuration not disclosed herein in addition to the configurations described hereinabove. Further, if a configuration or operation of an entire system is substantially the same, then some of the components of a certain apparatus or processing section may be included in the configuration of some other apparatus or processing section.

While the preferred embodiments of the present disclosure have been described in detail with reference to the accompanying drawings, the technical scope of the present disclosure is not limited to the embodiments described above. It is apparent that those who have common knowledge in the technical field of the present disclosure could make various alterations or modifications without departing from the technical scope described in the claims, and it shall be interpreted that also such alterations and modifications naturally fall within the technical scope of the present disclosure.

For example, the present technology can assume a configuration of a crowd computer wherein a plurality of apparatus share and cooperate with each other through a network to process one function.

Further, each of the steps described hereinabove with reference to the flow charts may be executed by a single apparatus or may be shared and executed by a plurality of apparatus.

Further, in the case where a plurality of processes are included in one step, the processes included in the one step may be executed by one apparatus or may be shared and executed by a plurality of apparatus.

It is to be noted that the present technology can take such configurations as described below.

(1) A signal processing apparatus, including:
a short-circuiting controlling section configured to control whether or not the input side of a resistor connected between an input terminal and an output terminal and the output terminal are to be short-circuited in response to a signal level of a signal inputted from the input terminal; and a connection controlling section configured to control whether or not a resistor member is to be connected between the output terminal and a reference potential in response to the signal level of the signal, wherein at least one of the short-circuiting controlling section and the connection controlling section includes a plurality of switches disposed in parallel to each other for changing over a state thereof between open and closed states at signal levels different from each other.

(2) The signal processing apparatus (1) above, wherein the switches are individually configured from an MOS transistor whose gate potential varies in response to the signal level of the signal; and the gate potentials of the switches transit at the signal levels different from each other.

(3) The signal processing apparatus according to (1) or (2) above, wherein the signal levels for changing over between the open and closed states of the plurality of switches are set such that the signal level increases toward the output terminal side.

(4) The signal processing apparatus according to any one of (1) to (3) above, wherein the plurality of switches have impedances which are equal to each other.

(5) The signal processing apparatus according to any one of (1) to (4), wherein the plurality of switches have impedances set such that the impedance increases toward the output terminal side.

(6) The signal processing apparatus according to any one of (1) to (5), wherein a plurality of units individually including the resistor, short-circuiting controlling section and connection controlling section are connected in series between the input and output terminals.

(7) The signal processing apparatus according to any one of (1) to (6), wherein the resistor member provided between the output terminal and the reference potential has a doubled resistance value with respect to a resistance value of the resistor connected between the input and output terminals.

(8) The signal processing apparatus according to any one of (1) to (7), further including an amplification section configured to amplify the signal outputted from the output terminal.

(9) The signal processing apparatus according to any one of (1) to (8), further including a control section configured to control the switches between the open and closed states based on the signal level of the signal.

(10) The signal processing apparatus according to (9) above, wherein, where the short-circuiting controlling section includes the plurality of switches, the control section increases the number of those switches which are in an off state as the signal level of the signal increases.

(11) The signal processing apparatus according to (10) above, wherein the controlling section increases the number of the switches which are in an off state in proportion to the magnitude of the signal level of the signal.

(12) The signal processing apparatus according to any one of (9) to (11), wherein, where the connection controlling section includes the plurality of switches, the control section controls the switches between the open and closed states such that the resistance value between the output terminal and the reference potential decreases as the signal level of the signal increases.

(13) The signal processing apparatus according to (12) above, wherein the control section controls the switches between the open and closed states such that the resistance value changes in inverse proportion to the magnitude of the signal level of the signal.

(14) The signal processing apparatus according to any one of (9) to (13), wherein the control section changes over the switches disposed in parallel to each other between the open and closed states at the signal levels different by a predetermined level interval from each other.

(15) A signal processing method for a signal processing apparatus, the method executed by the signal processing apparatus including:

monitoring a signal level of an inputted signal;

determining a control signal value for each of a plurality of switches which are disposed in parallel to each other so as to configure at least one of a short-circuiting controlling section for controlling whether or not the input side of a resistor connected between an input terminal and an output terminal and the output terminal are to be short-circuited in response to the signal level of the signal inputted from the input terminal and a connection controlling section for controlling whether or not a resistor member is to be connected between the output terminal and a reference potential in response to the signal level of the signal and which change over between open and closed states at signal levels different from each other; and supplying the control signals to the switches.

(16) A communication apparatus, including:

a reception section configured to receive a signal;

an amplification section configured to amplify the signal;

a short-circuiting controlling section configured to control whether or not the reception section side of a resistor connected between the reception section and the amplification section and the amplification section are to be short-circuited in response to a signal level of the signal; and a connection controlling section configured to control whether or not a resistor member is to be connected between the amplification section and a reference potential in response to the signal level of the signal, wherein at least one of the short-circuiting controlling section and the connection controlling section includes a plurality of switches which are disposed in parallel to each other and change over whether the opposite ends of the short-circuiting controlling section or the connection controlling section are to be connected to each other or are to be disconnected from each other at signal levels different from each other.

The present disclosure contains subject matter related to that disclosed in Japanese Priority Patent Application JP 2012-120416 filed in the Japan Patent Office on May 28, 2012, the entire content of which is hereby incorporated by reference.

What is claimed is:

1. A signal processing apparatus, comprising:
a short-circuiting controlling section configured to control whether or not the input side of a resistor connected between an input terminal and an output terminal and the output terminal are to be short-circuited in response to a signal level of a signal inputted from the input terminal; and
a connection controlling section configured to control whether or not a resistor member is to be connected between the output terminal and a reference potential in response to the signal level of the signal,
wherein at least one of the short-circuiting controlling section and the connection controlling section includes a plurality of switches disposed in parallel to each other for changing over a state thereof between open and closed states at signal levels different from each other.

2. The signal processing apparatus according to claim 1, wherein the switches are individually configured from a metal oxide semiconductor transistor whose gate potential varies in response to the signal level of the signal; and the gate potentials of the switches transit at the signal levels different from each other.

3. The signal processing apparatus according to claim 1, wherein the signal levels for changing over between the open and closed states of the plurality of switches are set such that the signal level increases toward the output terminal side.

4. The signal processing apparatus according to claim 1, wherein the plurality of switches have impedances which are equal to each other.

5. The signal processing apparatus according to claim 1, wherein the plurality of switches have impedances set such that the impedance increases toward the output terminal side.

6. The signal processing apparatus according to claim 1, wherein a plurality of units individually including the resistor, short-circuiting controlling section and connection controlling section are connected in series between the input and output terminals.

7. The signal processing apparatus according to claim 1, wherein the resistor member provided between the output terminal and the reference potential has a doubled resistance value with respect to a resistance value of the resistor connected between the input and output terminals.

8. The signal processing apparatus according to claim 1, further comprising
an amplification section configured to amplify the signal outputted from the output terminal.

9. The signal processing apparatus according to claim 1, further comprising
a control section configured to control the switches between the open and closed states based on the signal level of the signal.

10. The signal processing apparatus according to claim 9, wherein, where the short-circuiting controlling section includes the plurality of switches, the control section increases the number of those switches which are in an off state as the signal level of the signal increases.

11. The signal processing apparatus according to claim 10, wherein the controlling section increases the number of the switches which are in an off state in proportion to the magnitude of the signal level of the signal.

12. The signal processing apparatus according to claim 9, wherein, where the connection controlling section includes the plurality of switches, the control section controls the switches between the open and closed states such that the resistance value between the output terminal and the reference potential decreases as the signal level of the signal increases.

13. The signal processing apparatus according to claim 12, wherein the control section controls the switches between the open and closed states such that the resistance value changes in inverse proportion to the magnitude of the signal level of the signal.

14. The signal processing apparatus according to claim 9, wherein the control section changes over the switches disposed in parallel to each other between the open and closed states at the signal levels different by a predetermined level interval from each other.

15. A signal processing method for a signal processing apparatus, the method executed by the signal processing apparatus comprising:

monitoring a signal level of an inputted signal;

determining a control signal value for each of a plurality of switches which are disposed in parallel to each other so as to configure at least one of a short-circuiting controlling section for controlling whether or not the input side of a resistor connected between an input terminal and an output terminal and the output terminal are to be short-circuited in response to the signal level of the signal inputted from the input terminal and a connection controlling section for controlling whether or not a resistor member is to be connected between the output terminal and a reference potential in response to the signal level of the signal and which change over between open and closed states at signal levels different from each other; and supplying the control signals to the switches.

16. A communication apparatus, comprising:

a reception section configured to receive a signal;

an amplification section configured to amplify the signal;

a short-circuiting controlling section configured to control whether or not the reception section side of a resistor connected between the reception section and the amplification section and the amplification section are to be short-circuited in response to a signal level of the signal; and a connection controlling section configured to control whether or not a resistor member is to be connected between the amplification section and a reference potential in response to the signal level of the signal, wherein at least one of the short-circuiting controlling section and the connection controlling section includes a plurality of switches which are disposed in parallel to each other and change over whether the opposite ends of the short-circuiting controlling section or the connection controlling section are to be connected to each other or are to be disconnected from each other at signal levels different from each other.

* * * * *